US006556344B2

(12) United States Patent
Koren

(10) Patent No.: US 6,556,344 B2
(45) Date of Patent: Apr. 29, 2003

(54) MONITORING OF OPTICAL RADIATION IN SEMICONDUCTOR DEVICES

(75) Inventor: Uzi Koren, Karmiel (IL)

(73) Assignee: Cyoptics (Israel) Ltd., Yokneam Illit (IL)

( * ) Notice: Subject to any disclaimer, the term of this patent is extended or adjusted under 35 U.S.C. 154(b) by 0 days.

(21) Appl. No.: 09/767,203

(22) Filed: Jan. 22, 2001

(65) Prior Publication Data

US 2001/0055149 A1 Dec. 27, 2001

Related U.S. Application Data

(60) Provisional application No. 60/177,405, filed on Jan. 20, 2000.

(51) Int. Cl.[7] ...................... H04B 10/17; H01S 3/0933; G02B 6/125

(52) U.S. Cl. ...................... 359/341.4; 359/344; 385/14

(58) Field of Search .............................. 359/344, 341.4, 359/341.41, 341.42; 385/13, 14, 132

(56) References Cited

U.S. PATENT DOCUMENTS

| | | | | |
|---|---|---|---|---|
| 4,618,212 A | * | 10/1986 | Ludington et al. | 356/73.1 |
| 4,996,420 A | * | 2/1991 | Redford | 250/227.24 |
| 5,134,671 A | * | 7/1992 | Koren et al. | 385/14 |
| 5,245,690 A | * | 9/1993 | Aida et al. | 385/142 |
| 5,309,469 A | * | 5/1994 | Koren | 372/50 |
| 5,414,554 A | * | 5/1995 | Aoyama | 359/344 |
| 5,608,572 A | * | 3/1997 | Nitta | 359/344 |
| 6,052,222 A | * | 4/2000 | Kitamura | 359/344 |
| 6,243,525 B1 | * | 6/2001 | Luizink et al. | 385/131 |

FOREIGN PATENT DOCUMENTS

JP           03074494       *  3/1991

OTHER PUBLICATIONS

Liou, K.-Y. et al. "Operation of Integrated InGaAsP-InP Optical Amplifier-Monitoring Detector with Feedback Control Circuit." IEEE Photonics Tech. Lett. 2:12, Dec. 1990, pp. 878-880.*
Deri, R.J. "Monolithic Integration of Optical Waveguide Circuitry ith III-V Photodetectors for Advanced Lightwave Receivers." J Lightwave Tech. 11:8, Aug. 1993, pp. 1296-1313.*
Deri, R.J. and Kapon, E. "Low-Loss III-V Semiconductor Optical Waveguides." IEEE J. Quantum Electronics, 27:3. Mar. 1991, pp. 626-640.*
Koch, T.L and Koren, U. "Semiconductor Photonic Integrated Circuits." IEEE J. Quantum Electronics. 27:3, Mar. 1991. pp. 641-653.*
Newkirk, M.A. et al. "Three-Section Semiconductor Optical Amplifier Monitoring for Optical Gain." IEEE Photonics Tech. Lett. 4:11, Nov. 1992. pp. 1258-1260.*

(List continued on next page.)

Primary Examiner—Thomas G. Black
Assistant Examiner—Andrew R. Sommer

(57) ABSTRACT

An optical radiation monitor and an optical amplifier. The radiation monitor consists of an input port which receives the optical radiation, a waveguide, coupled to the input port so as to receive the optical radiation therefrom and adapted to leak a predetermined fraction of the optical radiation, and a photodetector which receives at least some of the leaked optical radiation and which generates a monitoring signal responsive thereto.

The optical amplifier consists of an optical gain region which is adapted to output amplified optical radiation responsive to a current injected into the section. The amplifier includes a waveguide coupled to receive the amplified optical radiation and adapted to leak a predetermined fraction of the amplified optical radiation. The amplifier also includes a photodetector which receives at least some of the leaked optical radiation and which generates a monitoring signal responsive thereto, indicative of a performance characteristic of the optical gain region.

15 Claims, 1 Drawing Sheet

OTHER PUBLICATIONS

Alferness, R.C. et al. "Integrated MQW Optical Amplifier/Noise–Filter/Photodetector Photonic Circuit." IEEE Photonics Tech. Lett. 5:12, Dec. 1993. pp. 1401–1403.*

Tiemeijer, L.F. et al. "High–Gain 1310 nm Semiconductor Optical Amplifier Modules with Built–in Amplified Signal Monitor for Optical Gain Control." IEEE Photonics Tech. Lett. 9:3, Mar. 1997. pp. 309–311.*

L.H. Spikeman, et al. "160 Gbit/s (8×20 Gbit/s) DWDM Transmission over 160 km of Standard Fiber Using a Cascade of Semiconductor Optical Amplifiers." 25$^{th}$ ECOC, 1999, Post Deadline Paper PD2–7.*

C.H. Zah, et al. "Fabrication and Performance of 1.5 um GaInAsP Travelling Wave Laser Amplifiers With Angled Facets." Elec Lett. 23:19, pp. 990–991, Sep. 1987.*

* cited by examiner

MONITORING OF OPTICAL RADIATION IN SEMICONDUCTOR DEVICES

CROSS-REFERENCE TO RELATED APPLICATIONS

This application claims the benefit of U.S. Provisional Application 60/177,405, filed Jan. 20, 2000, which is assigned to the assignee of the present patent application and is incorporated herein by reference.

FIELD OF THE INVENTION

The present invention relates generally to elements conveying optical radiation, and specifically to semiconductor devices conveying optical radiation.

BACKGROUND OF THE INVENTION

Semiconductor optical amplifiers (SOAs) are well known in the art as relatively inexpensive gain elements, and are used, inter alia, either singly or in cascade to compensate for reductions in power in optical networks. The reductions in power may be caused, for example, by losses generated by relatively long lengths of fibers, or by using elements such as one-to-many splitters within the network.

Unfortunately, SOAs suffer from a number of problems caused by inherent gain non-linearities and relatively long gain recovery times. For example, transmitting a long series of ones via an SOA can cause gain saturation in the SOA, so that a following zero bit is subject to gain compression. Similarly, a long series of zero bits causes a following one bit to be subject to an undesired high gain. Effects such as these lead to problems such as inter-symbol interference between bits of a single data stream, and also to cross-talk between bits in pluralities of data streams such as when wavelength division multiplexing is used.

One solution to the problems is to operate the SOA at a substantially average constant output power level, which is preferably set below, a 3 dB saturation level of the SOA. An example of this approach is described in an article titled "160 Tb/sec DWDM transmission over 160 km of standard fiber using a cascade of SOA's," by L. H. Spiekman et al., in the post deadline paper PD2-7 of the 25$^{th}$ European Conference of Optical Communications (1999), which is incorporated herein by reference. The article describes monitoring the output of an SOA.

In implementing waveguides in semiconductor devices such as SOAs, parasitic reflections at input and output facets of the device can degrade the performance of the device. The parasitic reflections can be substantially reduced by anti-reflection coating of the facets, and also by implementing the waveguides so they are tilted, i.e., non-orthogonal, to the facets. An example of this approach is described in an article titled "Fabrication and Performance of 1.5 µm Traveling Wave Amplifiers with Angled Facets," by C. E. Zah et al., in the Vol. 21 (1987) issue of *Electronics Letters*, which is incorporated herein by reference.

A further problem in implementing waveguides in semiconductors is that curvature of the waveguide causes radiation leakage from the waveguide. The leaked radiation is a function of the radius of curvature; it is also a function of the refractive index ratio of the semiconducting material implementing the waveguide and the surrounding substrate within which the waveguide is implemented. As is shown in an article titled "Low loss III–V semiconductor optical waveguides" by R. J. Deri et al., in the Vol QE-27 (1991) issue of *IEEE Journal of Quantum Electronics*, which is incorporated herein by reference, the leakage can be controlled by careful choice of radius of curvature and the refractive indices of the media involved.

SUMMARY OF THE INVENTION

It is an object of some aspects of the present invention to provide a method and apparatus for monitoring a power output of an optical amplifier.

It is a further object of some aspects of the present invention to provide a method and apparatus for improving gain characteristics of the optical amplifier.

It is another object of some aspects of the present invention to provide a method and apparatus for monitoring optical radiation traversing a waveguide.

In some preferred embodiments of the present invention, an optical amplifier is implemented in a semiconductor device. The device comprises a waveguide, through which light is output from the amplifier. The waveguide comprises a curved section. By setting values for its radius of curvature, length, and refractive index step, the curved section is formed so that a known, substantially fixed, fraction of the amplifier output leaks from the section. A photodetector is implemented in the semiconductor device in a position where it captures the leaked light. The photodetector generates an output directly related to a power of the leaked light and thus to the amplifier output. Thus, unlike other amplifiers and output monitors known in the art, the light amplifier and output monitor are implemented together in one monolithic semiconductor device.

In some preferred embodiments of the present invention, the output from the photodetector is used in a negative feedback loop for controlling a bias current to the optical amplifier. By controlling the bias current responsive to the output light power, effects due to gain saturation and long gain recovery time of the amplifier are substantially reduced.

In other preferred embodiments of the present invention, an optical radiation monitor is implemented as a monolithic device comprising a curved waveguide coupled, as described above, to a photodetector, absent an optical amplifier. Output from the photodetector provides a measure of the optical radiation travelling through the waveguide.

There is therefore provided, according to a preferred embodiment of the present invention, an optical radiation monitor, including:

an input port which receives the optical radiation;

a waveguide, coupled to the input port so as to receive the optical radiation Therefrom and adapted to leak a predetermined fraction of the optical radiation; and a photodetector which receives at least some of the leaked optical radiation and which generates a monitoring signal responsive thereto.

Preferably, the waveguide and photodetector are integrally formed on a single, common substrate of semiconductor material.

Preferably, the waveguide includes a curved waveguide having a predetermined radius of curvature and a refractive index different from a refractive index of the substrate.

Preferably, the input port is coupled to an input waveguide and the waveguide is coupled to an output waveguide, wherein the input and output waveguides are integrally formed on the single, common substrate.

There is further provided, according to a preferred embodiment of the present invention, an optical amplifier, including:

an optical gain region which is adapted to output amplified optical radiation responsive to a current injected into the section;

a waveguide, coupled to receive the amplified optical radiation, and adapted to leak a predetermined fraction of the amplified optical radiation; and a photodetector which receives at least some of the leaked optical radiation and which generates a monitoring signal responsive thereto, indicative of a performance characteristic of the optical gain region.

Preferably, the gain region, the waveguide and photodetector are integrally formed on a single, common substrate of semiconductor material.

Further preferably, the apparatus includes a feedback control, which is coupled to receive the monitoring signal and to alter the injected current responsive to the monitoring signal.

Preferably, the waveguide includes a curved waveguide having a predetermined radius of curvature and a refractive index different from a refractive index of the substrate.

Preferably, the performance characteristic includes at least one of a group of parameters comprising an output power level of the optical gain region, and a pulse length, an extinction ratio, and a spontaneous emission level of optical radiation therein.

There is further provided, according to a preferred embodiment of the present invention, a method for monitoring optical radiation, including:

inputting the optical radiation into a waveguide;

arranging the waveguide so that a predetermined fraction of the optical radiation leaks from the waveguide; and measuring the leaked optical radiation so as to monitor a characteristic of the radiation in the waveguide.

Preferably, measuring the leaked optical radiation includes providing a photodetector to perform the measurement, and arranging the waveguide includes integrally forming the waveguide and photodetector on a single, common substrate of semiconductor material.

Preferably, arranging the waveguide includes forming a curved waveguide in a substrate, the curved waveguide having a predetermined radius of curvature and a refractive index different from a refractive index of the substrate.

There is further provided, according to a preferred embodiment of the present invention, a method for amplifying optical radiation, including:

injecting current into an optical gain region so as to engender amplification of the optical radiation in the region;

coupling the amplified optical radiation into a waveguide;

arranging the waveguide so that a predetermined fraction of the amplified optical radiation leaks from the waveguide; and generating a monitoring signal, indicative of a performance characteristic of the optical gain region, responsive to the leaked optical radiation.

Preferably, the method includes varying the injected current responsive to the monitoring signal.

Preferably, the method includes providing a photodetector to measure the monitoring signal, and integrally forming the optical gain region, the waveguide, and the photodetector on a single, common substrate of semiconductor material.

The present invention will be more fully understood from the following detailed description of the preferred embodiments thereof, taken together with the drawing, in which:

DETAILED DESCRIPTION OF PREFERRED EMBODIMENTS

Figure 1:
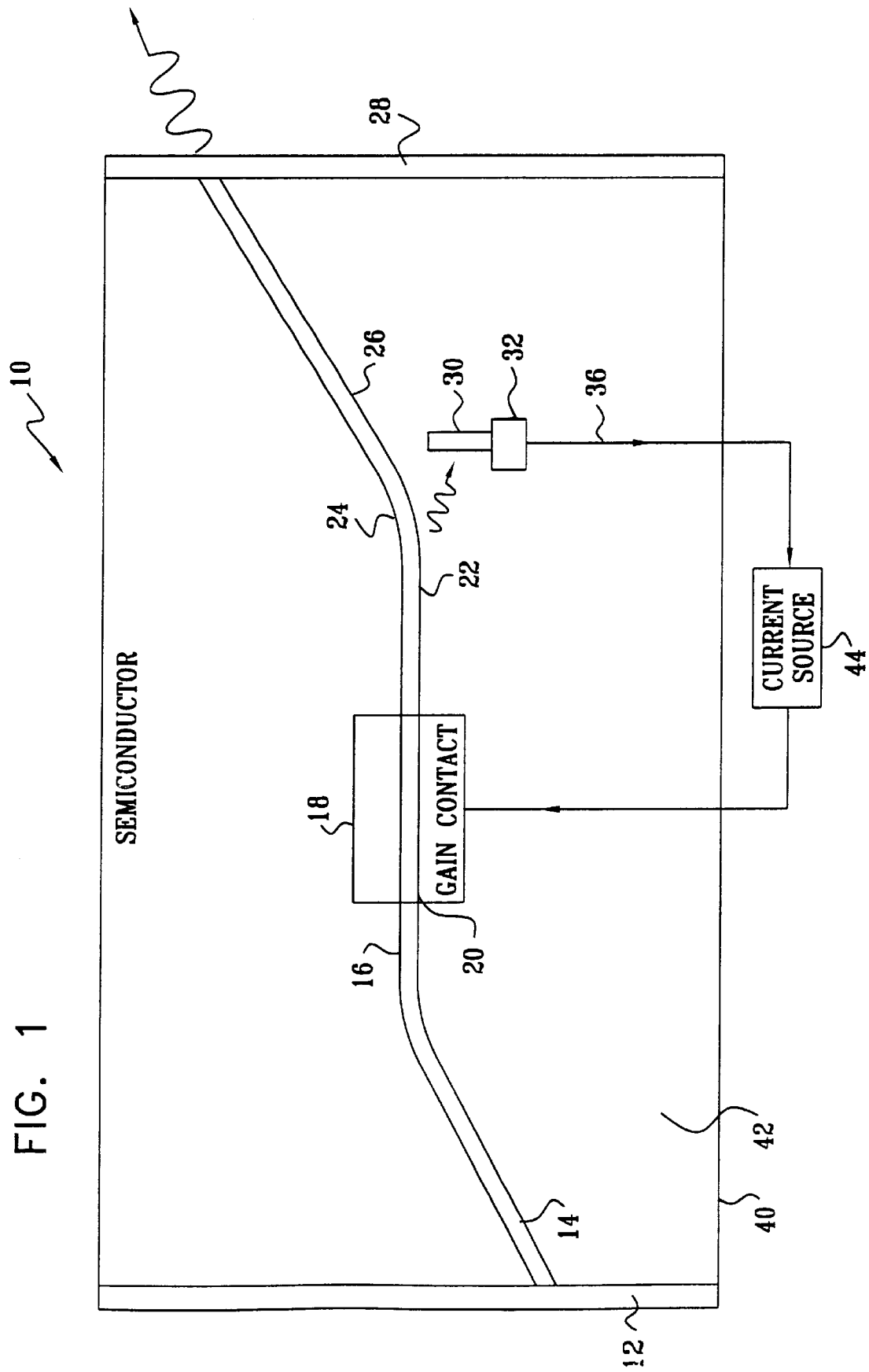
FIG. 1 is a schematic diagram of an optical amplifier with integral output monitor, according to a preferred embodiment of the present invention.

Reference is now made to FIG. 1, which is a schematic diagram of an optical amplifier 10, according to a preferred embodiment of the present invention. Amplifier 10 is implemented in a semiconductor device 40 comprising a substrate 42, having a generally box-like shape. An input facet 12 and an output facet 28 of device 40 are most preferably anti-reflection coated. An input linear waveguide section 14 and an output linear waveguide section 26 are respectively coupled to input facet 12 and output facet 28. Section 14 and 26, and other elements described hereinbelow as comprised in device 40, are written onto the semiconductor device by photolithographic and etching techniques, as is known in the art. Sections 14 and 26 are most preferably tilted, i.e., they are non-orthogonal, with respect to their respective facets, so that the combination of antireflection coating of the facets and tilting of the waveguides substantially reduces parasitic reflections at facet 12 and facet 28.

Device 40 comprises a waveguide section 20, which functions as a gain region and is oriented substantially orthogonally with respect to facets 12 and 28, and which is activated by injecting a current into the section via a gain contact pad 18. The current to pad 18 is supplied by a current source 44, which preferably comprises one or more components external to device 40. Gain section 20 is coupled to input waveguide section 14 by a curved waveguide section 16, and to output waveguide section 26 by a curved waveguide section 24. Curved section 24 has a radius and a refractive index, different from the refractive index of substrate 40, which cause a substantially fixed fraction of the optical radiation which is travelling from section 20 towards facet 28 to leak from the curved section. Preferably, the radius is of the order of 0.5–1 mm, and the difference in refractive indices between the waveguide and the substrate is of the order of 0.1. It will be understood that the geometry of the waveguide sections, and the direction of travel of the optical radiation in the sections, cause the leaked radiation 34 from curved section 24 to be directed generally towards facet 28

A photodetector 30 is formed in device 40, close to section 24, in a position so as to intercept radiation 34. Photodetector 30 generates a current, substantially linearly dependent on the power of the intercepted radiation, which is output via a detector contact pad 32 coupled to the photodetector. Thus the combination of curved section 24 and phodetector 30 act as a monitor of the power of optical radiation traversing section 24. It will be appreciated that photodetector 30 is also able to monitor other parameters of the optical radiation, such as a pulse length of the radiation, an extinction ratio thereof, or a level of spontaneous emission in the absence of an optical signal.

In some preferred embodiments of the present invention, the output from contact pad 32 is fed via a control line 36 to current source 44, so that line 36 acts as a feedback control line for the source. Source 44 is implemented so that the feedback from line 36 acts as negative feedback, so stabilizing the operation of gain section 18. Most preferably, source 44 is implemented so that during operation of amplifier 10 an average level of optical radiation entering a port 22 of section 24 is maintained substantially constant at approximately 3 dB below a saturation level of gain section 18.

It will be appreciated that preferred embodiments of the present invention, using feedback as described above, enable SOAs to be implemented as monolithic devices which are substantially free from problems inherent in monolithic SOAs known in the art. Also, it will be understood that preferred embodiments of the present invention, absent the presence of a gain element, may be implemented as optical radiation monitors.

It will further be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An optical radiation monitor, comprising:

an input port which receives the optical radiation;

a waveguide having a first refractive index, coupled to the input port so as to receive the optical radiation therefrom and comprising a curved section having a predetermined radius of curvature, which is adapted to leak a predetermined fraction of the optical radiation to a region adjoining the waveguide which has a second refractive index different from the first refractive index; and a photodetector which receives at least some of the leaked optical radiation and which generates a monitoring signal responsive thereto, wherein the waveguide and photodetector are integrally formed on a single, common substrate of semiconductor material, and wherein the region adjoining the waveguide comprises the substrate.

2. A monitor according to claim 1, wherein the input port is coupled to an input waveguide and wherein the waveguide is coupled to an output waveguide, wherein the input and output waveguides are integrally formed on the single, common substrate.

3. A monitor according to claim 1, wherein the curved waveguide is curved in a plane parallel to the substrate, and wherein the photodetector is positioned to capture the radiation leaked in a direction approximately parallel to the plane.

4. A monitor according to claim 2, wherein the output waveguide terminates in an output port of the monitor.

5. An optical amplifier, comprising:

an optical gain region which is adapted to output amplified optical radiation responsive to a current injected into the section;

a waveguide having a first refractive index, coupled to receive the amplified optical radiation, and comprising a curved section having a predetermined radius of curvature, which is adapted to leak a predetermined fraction of the amplified optical radiation to a region adjoining the waveguide which has a second refractive index different from the first refractive index; and a photodetector which receives at least some of the leaked optical radiation and which generates a monitoring signal responsive thereto, indicative of a performance characteristic of the optical gain region.

6. An amplifier according to claim 5, wherein the gain region, the waveguide and photodetector are integrally formed on a single, common substrate of semiconductor material.

7. An amplifier according to claim 5, and comprising a feedback control, which is coupled to receive the monitoring signal and to alter the injected current responsive to the monitoring signal.

8. An amplifier according to claim 5, wherein the performance characteristic comprises at least one of a group of parameters comprising an output power level of the optical gain region, and a pulse length, an extinction ratio, and a spontaneous emission level of optical radiation therein.

9. An amplifier according to claim 5, wherein the gain region, the waveguide and photodetector are integrally formed on a single, common substrate of semiconductor material, and wherein the curved waveguide is curved in a plane parallel to the substrate, and wherein the photodetector is positioned to capture the radiation leaked in a direction approximately parallel to the plane.

10. A method for monitoring optical radiation, comprising:

inputting the optical radiation into a waveguide having a first refractive index;

forming the waveguide as a curved waveguide having a predetermined radius of curvature so that a predetermined fraction of the optical radiation leaks from the waveguide to a region adjoining the waveguide which has a second refractive index different from the first refractive index; and measuring the leaked optical radiation so as to monitor a characteristic of the radiation in the waveguide.

11. A method according to claim 10, wherein measuring the leaked optical radiation comprises providing a photodetector to perform the measurement, and wherein arranging the waveguide comprises integrally forming the waveguide and photodetector on a single, common substrate of semiconductor material.

12. A method according to claim 10, wherein the characteristic comprises an optical power of the radiation.

13. A method for amplifying optical radiation, comprising:

injecting current into an optical gain region so as to engender amplification of the optical radiation in the region;

coupling the amplified optical radiation into a waveguide having a first refractive index;

forming the waveguide as a curved waveguide having a predetermined radius of curvature so that a predetermined fraction of the amplified optical radiation leaks from the waveguide to a region adjoining the waveguide which has a second refractive index different from the first refractive index; and generating a monitoring signal, indicative of a performance characteristic of the optical gain region, responsive to the leaked optical radiation.

14. A method according to claim 13 and comprising varying the injected current responsive to the monitoring signal.

15. A method according to claim 13, and comprising providing a photodetector to measure the predetermined fraction of the amplified optical radiation, and integrally forming the optical gain region, the waveguide, and the photodetector on a single, common substrate of semiconductor material.

* * * * *